US009178061B2

(12) United States Patent
Cai et al.

(10) Patent No.: US 9,178,061 B2
(45) Date of Patent: Nov. 3, 2015

(54) METHOD FOR FABRICATING MOSFET ON SILICON-ON-INSULATOR WITH INTERNAL BODY CONTACT

(75) Inventors: Jin Cai, Courtlandt Manor, NY (US);
Steven J. Koester, Ossining, NY (US);
Amlan Majumdar, White Plains, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 13/572,039

(22) Filed: Aug. 10, 2012

(65) Prior Publication Data

US 2012/0309137 A1 Dec. 6, 2012

Related U.S. Application Data

(62) Division of application No. 12/480,254, filed on Jun. 8, 2009, now abandoned.

(51) Int. Cl.
*H01L 21/28* (2006.01)
*H01L 21/44* (2006.01)
(Continued)

(52) U.S. Cl.
CPC ........ *H01L 29/7835* (2013.01); *H01L 29/0847* (2013.01); *H01L 29/41733* (2013.01); *H01L 29/66659* (2013.01); *H01L 29/78612* (2013.01); *H01L 29/78621* (2013.01)

(58) Field of Classification Search
CPC .................. H01L 29/78615; H01L 29/66659; H01L 29/6659; H01L 29/7835; H01L 29/41766; H01L 29/78624; H01L 29/665
USPC .................................................. 438/580, 583
See application file for complete search history.

(56) References Cited

U.S. PATENT DOCUMENTS 4,899,202 A * 2/1990 Blake et al. .................... 257/336
5,160,989 A * 11/1992 Houston ........................ 257/347
(Continued)

FOREIGN PATENT DOCUMENTS

CN 1967850 5/2007

OTHER PUBLICATIONS

Office Action dated Sep. 19, 2011 for Chinese Patent Application No. 201010192411.7.

(Continued)

*Primary Examiner* — Kenneth Parker
*Assistant Examiner* — David Chen
(74) *Attorney, Agent, or Firm* — Fleit Gibbons Gutman Bongini & Bianco PL; Jon A. Gibbons

(57) ABSTRACT

A method is provided for fabricating a semiconductor device. According to the method, a semiconductor layer is formed over a semiconductor-on-insulator substrate, and a gate is formed on the semiconductor layer. Source and drain extension regions and a deep drain region are formed in the semiconductor layer. A deep source region is formed in the semiconductor layer. A drain metal-semiconductor alloy contact is located on the upper portion of the deep drain region and abutting the drain extension region. A source metal-semiconductor alloy contact abuts the source extension region. The deep source region is located below and contacts a first portion of the source metal-semiconductor alloy contact. The deep source region is not located below and does not contact a second portion of the source metal-semiconductor alloy contact. The second portion of the source metal-semiconductor alloy contact is an internal body contact that directly contacts the semiconductor layer.

18 Claims, 6 Drawing Sheets

(51) Int. Cl.
*H01L 29/78* (2006.01)
*H01L 29/08* (2006.01)
*H01L 29/417* (2006.01)
*H01L 29/66* (2006.01)
*H01L 29/786* (2006.01)

(56) References Cited

U.S. PATENT DOCUMENTS

| | | | |
|---|---|---|---|
| 5,821,575 | A | 10/1998 | Mistry et al. |
| 5,930,605 | A | 7/1999 | Mistry et al. |
| 6,060,364 | A | 5/2000 | Maszara et al. |
| 6,204,138 | B1 | 3/2001 | Krishnan et al. |
| 6,238,960 | B1 | 5/2001 | Maszara et al. |
| 6,441,434 | B1 * | 8/2002 | Long et al. .............. 257/347 |
| 6,790,750 | B1 | 9/2004 | Long et al. |
| 7,385,261 | B2 | 6/2008 | Lee |
| 2002/0050614 | A1 | 5/2002 | Unnikrishnan |
| 2002/0158291 | A1 * | 10/2002 | Wu .................... 257/347 |
| 2003/0025159 | A1 * | 2/2003 | Hogyoku .............. 257/347 |
| 2003/0213997 | A1 * | 11/2003 | Parker et al. ........... 257/357 |
| 2004/0031996 | A1 | 2/2004 | Li et al. |
| 2004/0087114 | A1 | 5/2004 | Xiang et al. |
| 2006/0246680 | A1 * | 11/2006 | Bhattacharyya ......... 438/400 |
| 2007/0111409 | A1 | 5/2007 | Watanabe et al. ....... 438/152 |
| 2007/0241401 | A1 * | 10/2007 | Tsujiuchi ............... 257/347 |
| 2008/0308867 | A1 | 12/2008 | Cai et al. |

OTHER PUBLICATIONS

Final Office Action dated Feb. 25, 2014 received for U.S. Appl. No. 12/480,254.
Office Action dated Mar. 30, 2011 for U.S. Appl. No. 12/480,254.
Final Office Action dated Oct. 11, 2011 for U.S. Appl. No. 12/480,254.
Office Action dated Sep. 16, 2013 for U.S. Appl. No. 12/480,254.
Cai, J., et al., "Ultra-Low Leakage Silicon-on-Insulator Technology for 65 nm Node and Beyond," Published in Electron Devices Meeting 2007, IEDM 2007 IEEE International, pp. 907-910, ISBN 978-1-4244-1508-3.
Lee, S., et al., "Record RF Performance of 45-nm SOI CMOS Technology," Published in Electron Devices Meeting, IEDM 2007, IEEE International, pp. 255-258, ISBN: 978-1-4244-1508-3.
Sleight, J., et al., "A compact Schottky body contact technology for SOI transistors," Published in Electron Devices Meeting, IEDM 1997, pp. 419-422, ISBN: 0-7803-4100-7.

* cited by examiner

METHOD FOR FABRICATING MOSFET ON SILICON-ON-INSULATOR WITH INTERNAL BODY CONTACT

CROSS REFERENCE TO RELATED APPLICATIONS

This application is a divisional of prior U.S. application Ser. No. 12/480,254, filed Jun. 8, 2009 now abandoned. The entire disclosure of U.S. application Ser. No. 12/480,254 is herein incorporated by reference.

FIELD OF THE INVENTION

The present invention generally relates to the field of semiconductors, and more particularly relates to metal oxide semiconductor field effect transistors ("MOSFETs") with internal body contacts.

BACKGROUND OF THE INVENTION

A conventional radio frequency ("RF") MOSFET produced on a silicon-on-insulator ("SOI") substrate includes a body contact in order to eliminate the floating body effect. While logic MOSFETs on an SOI substrate can tolerate the floating body effect, RF MOSFETs cannot do so, especially MOSFETs that are to be used for analog applications. This is because such RF MOSFETs need to be modeled very accurately, and the floating body effect is difficult to model because it is not a steady-state effect. Furthermore, the floating body effect often induces a kink in the drain current versus drain-source voltage (Id-Vds) characteristic. This degrades the linearity as well as the power gain of the transistor. Therefore, a body contact is provided for an RF MOSFET on an SOI substrate in order to give the transistor a body-tied configuration. The external contact to the body ensures a stable body potential. However, this external body contact requires extra area, and more specifically increases the perimeter of the drain-to-body junction. This increases the capacitance and reducing the achievable cut-off frequency (fT) and maximum frequency (fmax).

SUMMARY OF THE INVENTION

A semiconductor device is disclosed. The semiconductor device includes a semiconductor-on-insulator substrate including a buried insulator layer and an overlying semiconductor layer. The semiconductor layer is doped with a dopant of a first conductivity type. A gate is located on the semiconductor layer and includes a gate dielectric layer located on the semiconductor layer and a gate conductor layer located on the gate dielectric layer. A source extension region and a drain extension region are formed in the semiconductor layer. The source extension region and the drain extension region contact the gate dielectric layer. The source extension region and the drain extension region are doped with a dopant of a second conductivity type. A deep drain region is formed in the semiconductor layer. The deep drain region contacts the drain extension region and abuts the buried insulator layer. A deep source region is formed in the semiconductor layer. The deep source region contacts the source extension region and abuts the buried insulator layer. The deep drain region and the deep source region are doped with a dopant of the second conductivity type. A drain metal-semiconductor alloy contact is located on the upper portion of the deep drain region and abutting the drain extension region. A source metal-semiconductor alloy contact abuts the source extension region. The deep source region is located below and contacts a first portion of the source metal-semiconductor alloy contact. The deep source region is not located below and does not contact a second portion of the source metal-semiconductor alloy contact, such that the second portion of the source metal-semiconductor alloy contact is an internal body contact that directly contacts the semiconductor layer.

In another embodiment, an integrated circuit is disclosed. The integrated circuit includes a circuit supporting substrate including a semiconductor device. The semiconductor device comprises a semiconductor-on-insulator substrate including a buried insulator layer and an overlying semiconductor layer. The semiconductor layer is doped with a dopant of a first conductivity type. A gate is located on the semiconductor layer and includes a gate dielectric layer located on the semiconductor layer and a gate conductor layer located on the gate dielectric layer. A source extension region and a drain extension region are formed in the semiconductor layer. The source extension region and the drain extension region contact the gate dielectric layer. The source extension region and the drain extension region are doped with a dopant of a second conductivity type. A deep drain region is formed in the semiconductor layer. The deep drain region contacts the drain extension region and abuts the buried insulator layer. A deep source region is formed in the semiconductor layer. The deep source region contacts the source extension region and abuts the buried insulator layer. The deep drain region and the deep source region are doped with a dopant of the second conductivity type. A drain metal-semiconductor alloy contact is located on the upper portion of the deep drain region and abutting the drain extension region. A source metal-semiconductor alloy contact abuts the source extension region. The deep source region is located below and contacts a first portion of the source metal-semiconductor alloy contact. The deep source region is not located below and does not contact a second portion of the source metal-semiconductor alloy contact, such that the second portion of the source metal-semiconductor alloy contact is an internal body contact that directly contacts the semiconductor layer.

In yet another embodiment, a method for fabricating a semiconductor device is disclosed. The method includes forming a semiconductor-on-insulator substrate including a buried insulator layer. A semiconductor layer is formed over the semiconductor-on-insulator substrate. The semiconductor layer is doped with a dopant of a first conductivity type. A gate is formed on the semiconductor layer and includes a gate dielectric layer located on the semiconductor layer and a gate conductor layer located on the gate dielectric layer. A source extension region and a drain extension region are formed in the semiconductor layer. The source extension region and the drain extension region contact the gate dielectric layer. The source extension region and the drain extension region are doped with a dopant of a second conductivity type. A deep drain region is formed in the semiconductor layer. The deep drain region contacts the drain extension region and abuts the buried insulator layer. A deep source region is formed in the semiconductor layer. The deep source region contacts the source extension region and abuts the buried insulator layer. The deep drain region and the deep source region are doped with a dopant of the second conductivity type. A drain metal-semiconductor alloy contact is located on the upper portion of the deep drain region and abutting the drain extension region. A source metal-semiconductor alloy contact abuts the source extension region. The deep source region is located below and contacts a first portion of the source metal-semiconductor alloy contact. The deep source region is not located below and does not contact a second portion of the source metal-semiconductor alloy contact, such that the second portion of the source metal-semiconductor alloy contact is an internal body contact that directly contacts the semiconductor layer.

DETAILED DESCRIPTION

Preferred embodiments of the present invention will be described in detail hereinbelow with reference to the attached drawings.

Embodiments of the present invention utilize an internal body contact that does not require extra area to improve the performance of a metal oxide semiconductor field effect transistor ("MOSFET") on a silicon-on-insulator ("SOI") substrate. This MOSFET overcomes the problems discussed above because a body contact is provided without increasing the junction area of the transistor, and without increasing the capacitance of the MOSFET. Thus, the MOSFET can achieve higher speeds, while still suppressing the floating body effect for good linearity.

More specifically, compared to a conventional MOSFET on an SOI substrate with a body contact, the MOSFET of the present invention eliminates the capacitance penalty for providing the body contact, so as to increase speed. Further, the area of the MOSFET of the present invention is reduced compared to the conventional body-contacted MOSFET. Compared to a conventional floating-body MOSFET on an SOI substrate, the MOSFET of the present invention exhibits improved linearity and lower output conductance, which improves power gain. Additionally, the MOSFET of the present invention can be fabricated without any more mask layers than a conventional floating-body MOSFET. The internal body contact of the MOSFET of the present invention can be made solely through design changes to the conventional process flow, without the need for any additional processing steps (such as angled implants or alternate amorphization species).

Figure 1:
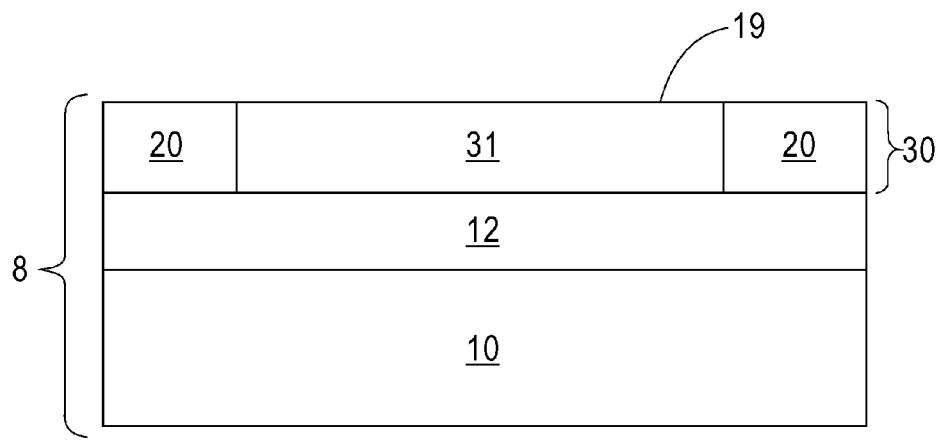
FIGS. 1-4 are cross-sectional views showing fabrication of a MOSFET on an SOI substrate according to one embodiment of the present invention.

FIGS. 1-4 show fabrication of a MOSFET on an SOI substrate according to one embodiment of the present invention. As shown in FIG. 1, an SOI substrate 8 is provided. The SOI substrate 8 is formed by a handle substrate 10 (e.g., a silicon substrate), an overlying buried insulator layer 12 (e.g., an oxide layer), and an overlying semiconductor layer 30. Shallow trench isolation regions 20 of a dielectric material are formed in the semiconductor layer 30. The shallow trench isolation region 20 abuts the buried insulator layer 12 and laterally surrounds an active region 31 in the semiconductor layer 30, so as to electrically isolate the active region 31 from other portions of the semiconductor layer 30 (e.g., other active regions).

In exemplary embodiments, the active region 31 comprises a single crystalline semiconductor material, such as silicon, germanium, a silicon-germanium alloy, a silicon-carbon alloy, a silicon-germanium-carbon alloy, gallium arsenide, indium arsenide, indium phosphide, a III-V compound semiconductor material, a II-VI compound semiconductor material, or an organic semiconductor material. In this exemplary embodiment, the semiconductor material comprises silicon. The active region 31 of this embodiment is doped with a dopant of a first conductivity type, such as a p-type dopant (e.g., boron, gallium, or indium) or an n-type dopant (e.g., phosphorus, arsenic, or antimony). The concentration of the dopant is from about $1.0 \times 10^{15}$ atoms/cm$^3$ to about $1.0 \times 10^{19}$ atoms/cm$^3$. Non-electrical stress-generating dopants, such as germanium and carbon may also be present. The active region 31 may also have a built-in biaxial stress in the plane of the active region 31 (i.e., in the plane perpendicular to the direction of the top surface 19 of the active region 31.

Figure 2:
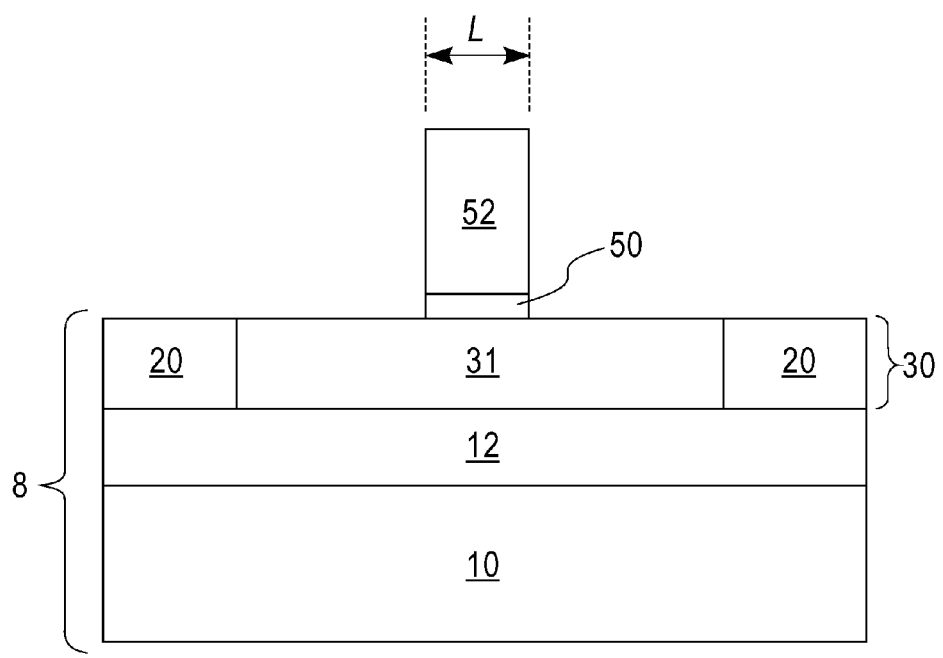

As shown in FIG. 2, a gate dielectric 50 and a gate conductor 52 are formed on the active region 31. More specifically, a stack of a gate dielectric layer and a gate conductor layer are formed on the active region 31. This stack is then lithographically patterned and etched to form the gate dielectric 50 and the overlying gate conductor 52 in a portion of the active region 31 of the semiconductor layer 30.

The gate dielectric 50 of this embodiment comprises a conventional dielectric material (such as silicon oxide, silicon nitride, silicon oxynitride, or a stack thereof) that is formed by thermal conversion of a top portion of the active region 31 and/or by chemical vapor deposition ("CVD"). In alternative embodiments, the gate dielectric 50 comprises a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed in a known manner (such as by CVD, atomic layer deposition ("ALD"), molecular beam epitaxy ("MBE"), pulsed laser deposition ("PLD"), liquid source misted chemical deposition ("LSMCD"), or physical vapor deposition ("PVD")). The thickness of the gate dielectric layer is from about 1 nm to about 3 nm in exemplary embodiment having a conventional dielectric material, and from about 2 nm to about 6 nm in exemplary embodiment having a high-k dielectric material, and may have an effective oxide thickness on the order of or less than 1 nm.

The gate conductor 52 comprises a semiconductor (e.g., polysilicon) gate layer and/or a metal gate layer. In one embodiment in which of the gate dielectric 50 comprises a conventional dielectric material, the gate conductor 52 is a semiconductor gate layer and has a thickness from about 40 nm to about 200 nm. In one embodiment in which the gate dielectric comprises a high-k dielectric material, the gate conductor 52 is a metal gate layer abutting the gate dielectric 50 and comprising a conductive refractory metal nitride (such as TaN, TiN, WN, TiAlN, TaCN, or an alloy thereof). The thickness of the metal gate layer in this embodiment is from about 2 nm to about 100 nm, and preferably from about 7 nm to about 50 nm. In another embodiment, the gate conductor 52 comprises a stack of a metal gate layer and a semiconductor gate layer.

The length L of the gate conductor 52 of this embodiment is determined by lithographic means, and is a lithographic minimum length (or a "critical dimension"). In some embodiments, a trimming etch is employed to reduce the length L of the gate conductor 52 to a length that is less than the lithographic minimum length.

Figure 3:
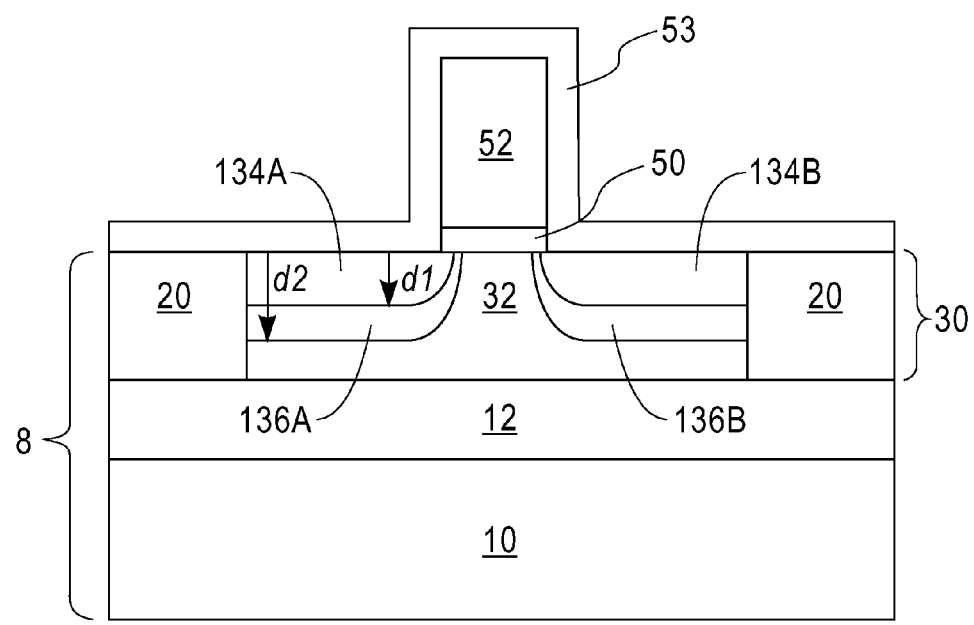

As shown in FIG. 3, a first gate spacer layer 53 comprising a dielectric material (such as silicon oxide) is then formed on the gate conductor 52 and on the semiconductor layer 30. Alternatively, a reactive-ion etch process can be used to remove the dielectric material on top of the gate and on the semiconductor layer so as to form a gate spacer only on the sidewall of the gate conductor 52. Ion implantations are performed into the semiconductor layer 30 employing the gate conductor 52 as an implantation mask in order to form a source extension region 134A and a drain extension region 134B that are self-aligned to the gate conductor 52. The source extension region 134A and the drain extension region 134B are formed in the semiconductor layer 30 at the same time. This ion implantation to form the extension regions can be performed before or after the formation of the first gate spacer layer 53, or alternatively formation of the first gate spacer layer 53 can be omitted. If the ion implantation follows formation of the first gate spacer layer 53, the vertical portions of the first gate spacer layer 53 on the sidewalls of the gate conductor 52 also serve as an implantation mask. In complementary MOSFET (CMOS) technologies which have both n-type MOSFETs and p-type MOSFETs, block masks are used to define where extension implants occur. In particular, one mask is used to open n-type MOSFET regions and block p-type MOSFET regions for ion implantation of n-type dopants in order to form source and drain extension regions in the n type MOSFETs. Another mask, complementary to the first mask, is used to open the p-type MOSFET regions and block n-type MOSFET regions for ion implantation of p-type dopants in order to form source and drain extension regions in the p-type-MOSFETs.

The portion of the active region that is not implanted with dopant ions during the ion implantation constitutes the body 32 of the MOSFET and has first conductivity type doping. The source extension region 134A and the drain extension region 134B has a first depth d1 (e.g., from about 5 nm to about 50 nm), and outer edges of these extension regions extend under the gate dielectric 50. Thus, the source extension region 134A and the drain extension region 134B both abut the gate dielectric 50 and have a second conductivity type doping, which is the opposite the first conductivity type doping. The source extension region 134A and the drain extension region 134B of this exemplary embodiment have a doping concentration from about $1.0 \times 10^{19}$ atoms/cm$^3$ to about $1.0 \times 10^{21}$ atoms/cm$^3$. In some embodiments, another ion implantation done at a tilted angle is then performed to form halo regions under the source and drain extension regions.

Figure 4:
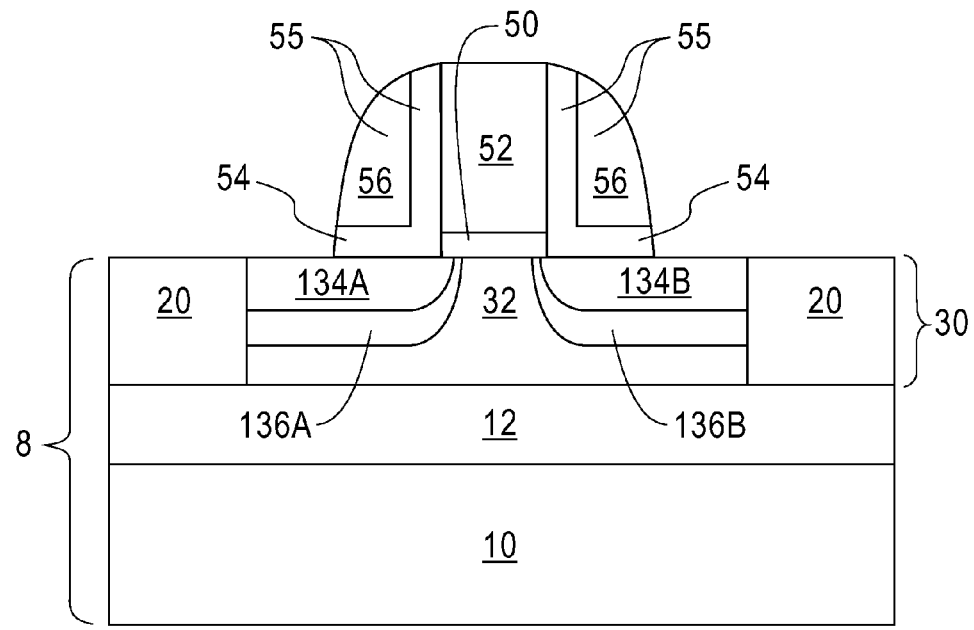

As shown in FIG. 4, a second gate spacer layer is deposited on the first gate spacer layer 53, and then these two layers are etched (e.g., using reactive ion etching) to form a gate spacer 55. This gate spacer 55 comprises the combination of the first gate spacer layer portion 54 and the second gate spacer layer portion 56. In exemplary embodiments, the second gate spacer layer portion 56 comprises a dielectric material that is the same as or different than the dielectric material of the first gate spacer layer portion 54. For example, in this embodiment the first gate spacer layer portion 54 comprises silicon oxide and the second gate spacer layer portion 56 comprises silicon nitride. The dielectric materials for the first and second gate spacer layer portions may include low-k dielectric materials. The portion of the first gate spacer layer 53 outside the outer sidewalls of the second gate spacer layer portion 56 is removed during the reactive ion etching.

Thus, the gate spacer 55 laterally abuts the sidewalls of the gate conductor 52 and the gate dielectric 50, and abuts the source extension region 134A and the drain extension region 134B. In this embodiment, the thickness of the gate spacer 55, as measured laterally at the base of the gate spacer 55 from the sidewall of the gate conductor 52 abutting the spacer 55 to an outer edge of the gate spacer 55 adjoining either the source extension region 134A or the drain extension region 134B, is from about 10 nm to about 100 nm, and preferably from about 20 nm to about 80 nm. In alternative embodiments, the gate spacer 55 is formed by only one or more than two gate spacer layers.

Figure 5:
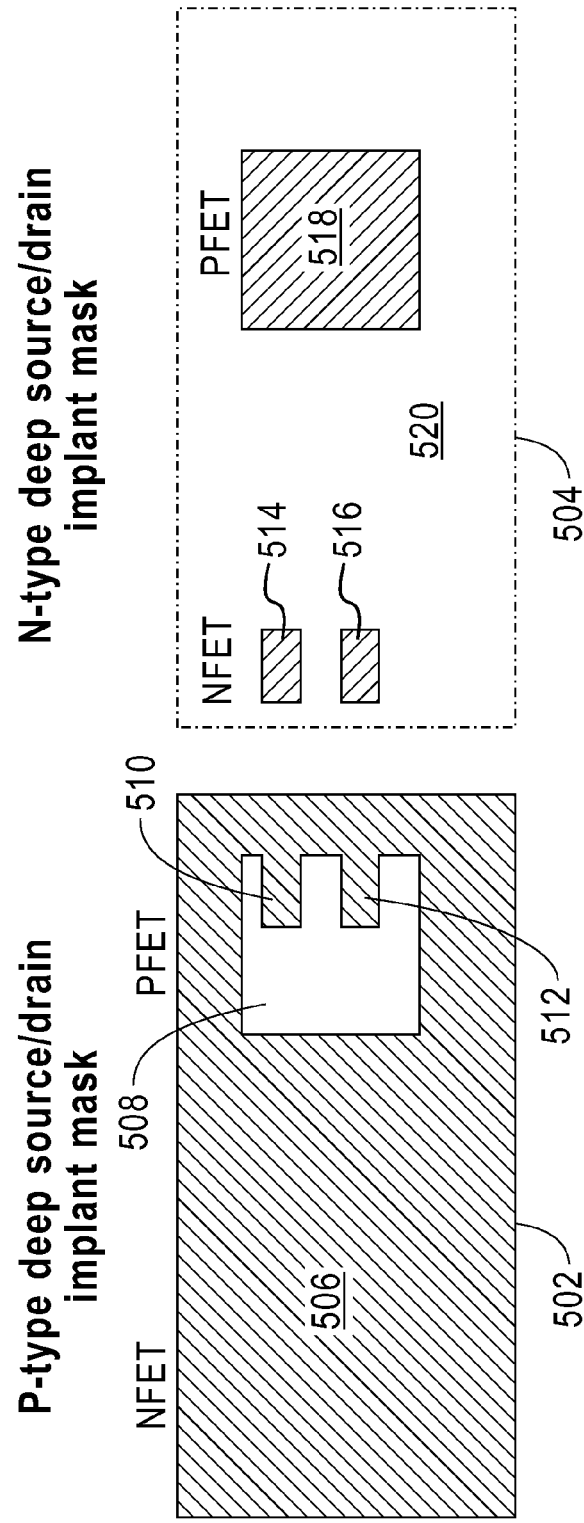
FIG. 5 illustrates masks for deep source-drain implants according to one embodiment of the present invention.

Next, deep source-drain implants are performed. More specifically, a mask is first formed to define where the deep source-drain implants will occur. FIG. 5 shows masks for deep source-drain implants according to one embodiment of the present invention. These masks include a first mask 502 for defining the deep source-drain implants of a p-type MOSFET and a second mask 504 defining the deep source-drain implants of an n-type MOSFET. The mask layout in FIG. 5 is used for making an n-type MOSFET (NFET) and a p-type-MOSFET (PFET). This is done for illustration purposes only and is not meant to limit the present invention. In practice, designs typically include multiple incidences of NFETs and PFETs, and can have any layout style.

The first mask 502 for a p-type MOSFET has a blocking region 506 where the deep source-drain implants are blocked and an open region 508 where the deep source-drain implants occur. Because the first mask 502 is for forming p-type MOSFETs, this mask blocks all of the area over the n-type device NFET along with the area over the p-type device PFET that is not to be implanted. Additionally, the blocking region 506 includes two extensions 510 and 512 that extend into the open region 508. While in this embodiment the additional block regions 510 and 512 are linked to the bigger blocking region 506, this is not the case in all embodiments. For example, in an alternative embodiment, the additional block regions 510 and 512 are 'islands' inside the open region 508.

The second mask 504 for an n-type MOSFET has a blocking region 518 where the deep source-drain implants are blocked and an open region 520 where the deep source-drain implants occur. Because the second mask 504 is for forming n-type MOSFETs, this mask blocks all of the area over the p-type device PFET. Additionally, the blocking region 518 includes two additional areas 514 and 516 in the open region 520 over the n-type device NFET.

Figure 6:
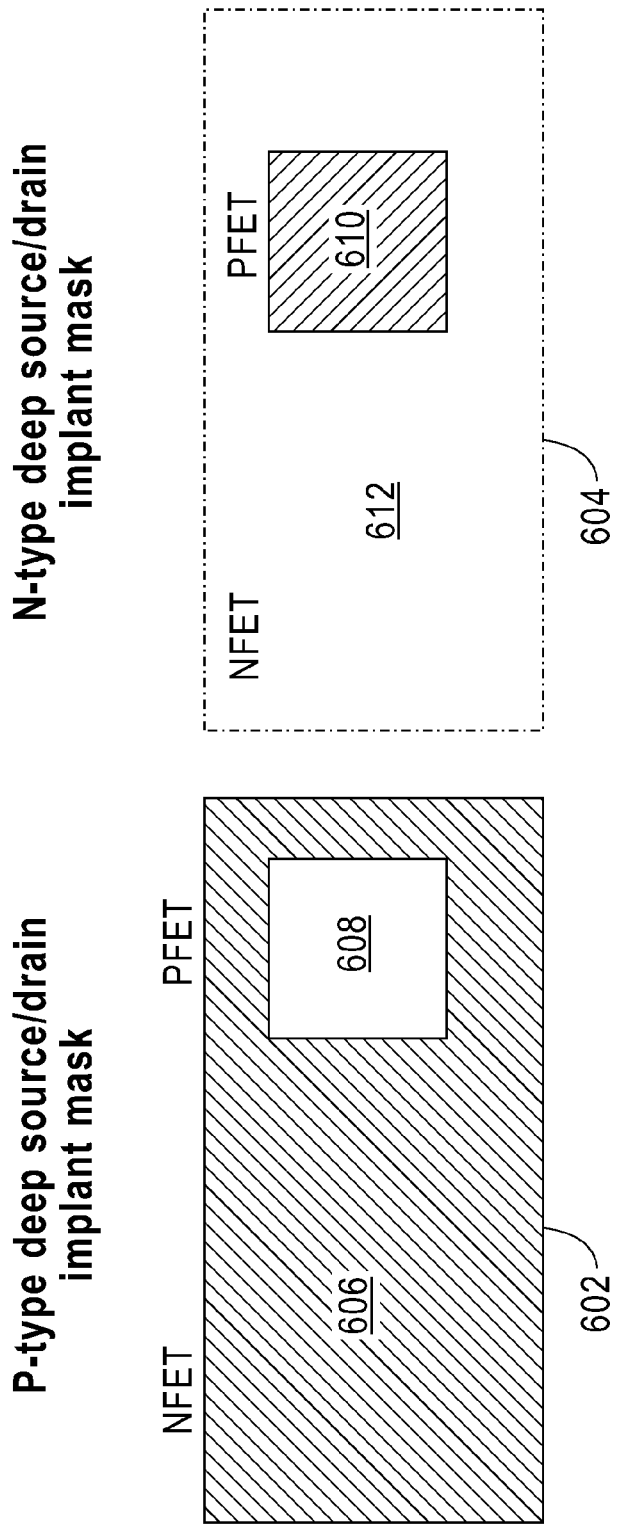
FIG. 6 illustrates conventional masks for deep source-drain implants.

The blocking regions 506 and 518 block the ions being implanted during the deep source-drain implants, while the open regions 508 and 520 allow the ions to pass through for deep source-drain implantation. In this embodiment of the present invention, the two extensions 510 and 512 of the blocking region 506 of the first mask 502 and the two additional areas 514 and 516 of the blocking region 518 of the second mask 504 are added to the design of these masks. This can be seen in a comparison with the conventional masks for deep source-drain implants shown in FIG. 6.

The first conventional mask 602 for a p-type MOSFET has a blocking region 606 where the deep source-drain implants are blocked, and an open region 608 where the deep source-drain implants occur. Because this mask is for forming p-type MOSFETs, all of the area over the n-type device NFET is blocked while a substantially square or rectangular area over the p-type device PFET is open so that it will be implanted. Similarly, the second conventional mask 604 for an n-type MOSFET has a blocking region 610 where the deep source-drain implants are blocked, and an open region 612 where the deep source-drain implants occur. Because this mask is for forming n-type MOSFETs, a substantially square or rectangular area over the p-type device PFET is blocked while all of the area over the n-type device NFET is open.

In the exemplary embodiment, the two extensions 510 and 512 of the blocking region 506 of the first mask 502 and the two additional areas 514 and 516 of the blocking region 518 of the second mask 504 are made to block the deep source-drain implant in a portion of the source region of the MOSFET. After the deep source-drain implantation has been performed, the mask is removed in a conventional manner and a subsequent rapid thermal anneal ("RTA") is performed (alternatively, millisecond laser anneal or flash anneal can be used) to provide relatively deep diffusions for the deep source and drain regions.

Figure 8:
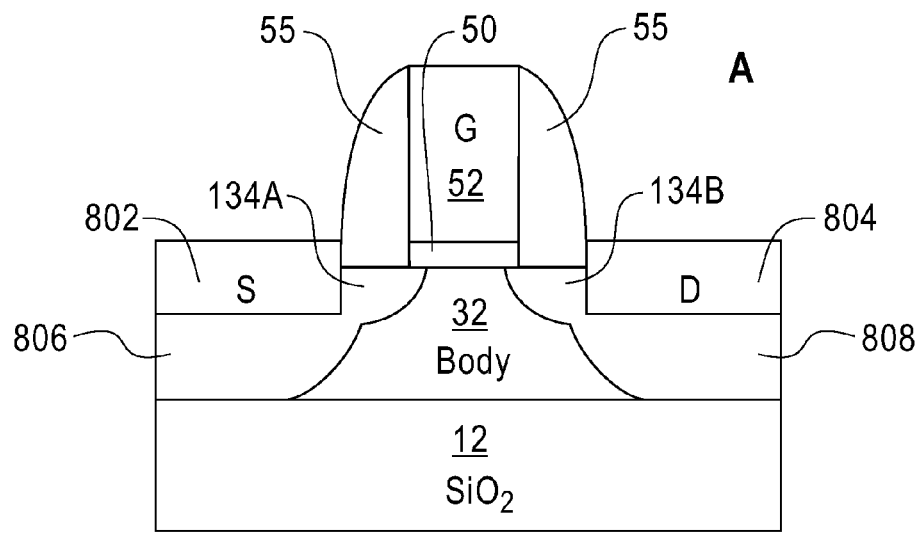
FIG. 8 shows a cross-sectional view of the MOSFET of FIG. 7 taken along line A.
Figure 9:
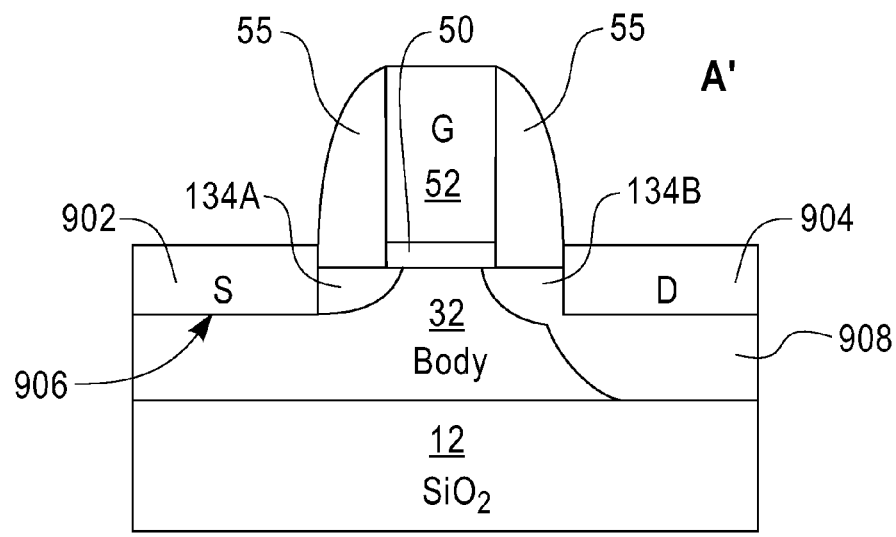
FIG. 9 shows a cross-sectional view of the MOSFET of FIG. 7 taken along line A'.

As shown in FIGS. 8 and 9, the deep-source drain implants form a deep source region 806 and a deep drain region 808. Next, a source silicide contact 802 and a drain silicide contact 804 are formed by metallization of exposed semiconductor material. In particular, in this embodiment, a metal layer is deposited directly on the overlying semiconductor layer (such as by a blanket deposition). The metal layer comprises a metal capable of forming a metal-semiconductor alloy with the semiconductor material of the overlying semiconductor layer (such as tungsten, tantalum, titanium, cobalt, nickel, platinum, osmium, or an alloy thereof). A preferred thickness of the metal layer ranges from about 5 nm to about 50 nm, and more preferably from about 10 nm to about 25 nm. In some embodiments, a metal nitride capping layer (e.g., containing a refractory metal nitride such as TaN, TiN, or OsN) is deposited over the metal layer.

An anneal is then performed so that the metal layer reacts with the semiconductor material of the overlying semiconductor layer to form the source silicide contact 802 directly over the deep source region 806 and the drain silicide contact 804 directly over the deep drain region 808.

Figure 7:
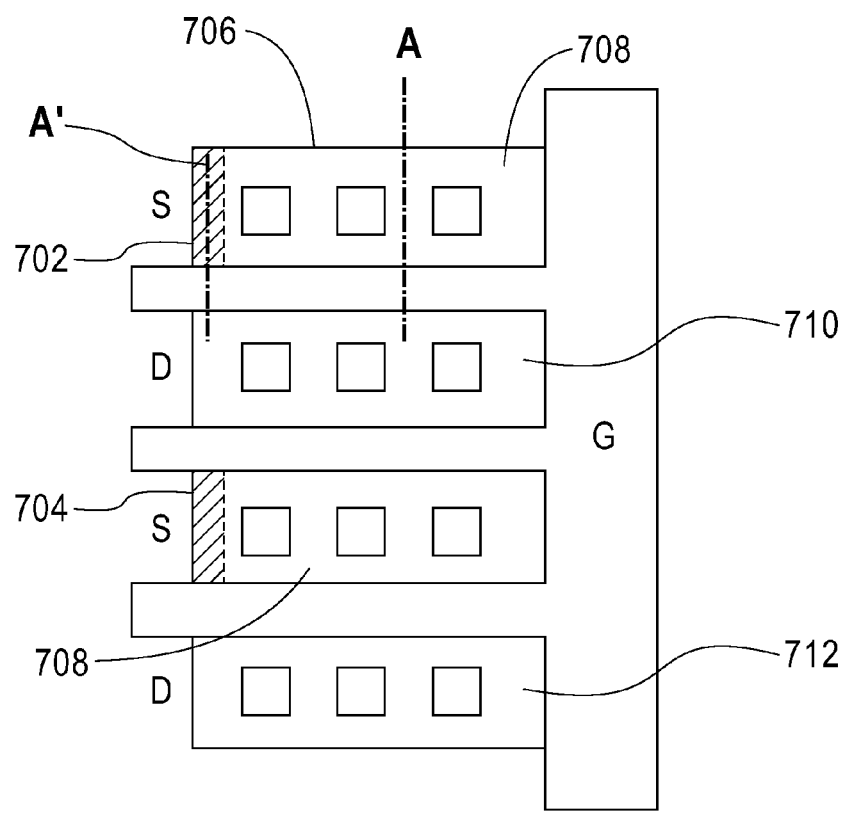
FIG. 7 shows a top-down view of a MOSFET on an SOI substrate according to one embodiment of the present invention.

The resulting structure is shown in FIGS. 7-9. FIG. 7 shows a top-down view with two source regions S and two drain regions D separated by gate conductors G, FIG. 8 shows a cross-sectional view taken along line A of FIG. 7, and FIG. 9 shows a cross-sectional view taken along line A' of FIG. 7. As shown in FIGS. 7 and 8, in one portion of the MOSFET the deep-source drain implants are not blocked in the source and drain regions. Thus, in this portion of the device the deep source region 806 underlies the source contact 802 and the deep drain region 808 underlies the drain contact 804. Further, the deep source region 806 contacts the source extension 134A and the deep drain region 808 contacts the drain extension 134B.

On the other hand, as shown in FIGS. 7 and 9, in another portion of the MOSFET the deep-source drain implants are not blocked in the drain region but are blocked in the source region. The implants are blocked in this portion of the source region by the extensions or additional areas of the blocking region of the masks used for deep source-drain implants. Thus, in this portion of the device the deep drain region 908 underlies the drain contact 904 but there is no deep source region underlying the source contact 902. Instead, the source contact 902 directly overlays the body 32 in this portion of the device. The deep drain region 908 contacts the drain extension 134B while the source contact 902 contacts the source extension 134A.

Thus, the deep source-drain implant is blocked at the ends of the source regions, so that at the ends of these regions (as shown by hatching in FIG. 7) there is no deep source region and the silicide of the source contact directly contacts the body. In the remainder of the source regions, the deep source regions underlie the source contact. Further, in all of each drain region, the deep drain region underlies the drain contact.

This structure provides an internal body contact at the ends of the source regions as shown in FIG. 9, while leaving the remainder of the source regions unchanged as shown in FIG. 8. Because the internal body contact also contacts the source extension region, body contact is made without a capacitance penalty compared to a floating body device. At the same time, there is only a small impact on the source resistance because the deep source implant underlies most of the source contact. Additionally, because the shallow source extension still directly connects the silicide contact to the area under the gate in the area where there is the internal body contact (i.e., where the silicide contact directly contacts the body), there is no loss of electrical device width in the body contact area. Thus, there is still current conduction in this area, so there is no loss of drive current due to the body contact.

The present invention is not limited to having the internal body contact located at only the far end of each source region. For example, in another embodiment there is additionally an internal body contact area at the other end of each source region, as shown by areas 702 in FIG. 7. Thus, in this embodiment a region at each end of each source region has an internal body contact. In another embodiment, this is further extended so that the deep source-drain implant is blocked in multiple regions of each source region to produce more body contacts. In yet another embodiment, the deep source-drain implant is blocked in a larger area at the end of each source region to produce a larger body contacts. In other embodiments, one or multiple such internal body contacts are provided at any location along each source region. As the area of the source region area that is used for internal body contact is increased, the control of the body potential is improved at the expense of increased source resistance. Preferably, only the area needed to maintain good control of the body potential is used for internal body contact.

After the contact areas are formed, the device is completed in a conventional manner and electrically connections are made between the contact areas and other devices so as to form an integrated circuit.

Accordingly, embodiments of the present invention provide a MOSFET on an SOI substrate with an internal body-tied configuration. The internal body contact allows the junction area and capacitance of the MOSFET to remain the same, while suppressing the floating body effect for better linearity. Thus, the capacitance penalty for providing a body contact is eliminated, which increases the speed. At the same time, the area of MOSFET is reduced compared to conventional body-contacted devices. Further, the MOSFET can be fabricated without any more mask layers than a conventional floating-body MOSFET. The internal body contact of the MOSFET is made solely through design changes to the conventional process flow, without the need for any additional processing steps.

The MOSFET of the present invention is particularly suited for use as an RF MOSFET. While the resulting MOSFET is asymmetric (i.e., the source and drain are not reversible), this is usually of no consequence for RF circuits, because the source and drain contacts rarely, if ever, need to have their polarity reversed in such circuits.

It should be noted that some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for fabricating a semiconductor device, the method comprising:
    providing a semiconductor-on-insulator substrate including a buried insulator layer; forming a semiconductor layer overlying the semiconductor-on-insulator substrate, the semiconductor layer being doped with a dopant of a first conductivity type;
    forming a gate structure located on the semiconductor layer, the gate structure comprising a gate dielectric layer located on the semiconductor layer and a gate conductor layer located on the gate dielectric layer, the gate structure including a first gate portion extending in a first direction, and a second gate portion extending from the first gate portion in a second direction, which is perpendicular to the first direction;
    forming a source extension region and a drain extension region in the semiconductor layer on opposite sides of the second gate portion of the gate structure, the source extension region and the drain extension region extending under the gate dielectric layer and the gate conductor layer, the source extension region and the drain extension region contacting the gate dielectric layer of the second gate portion, the source extension region and the drain extension region being doped with a dopant of a second conductivity type, which is opposite the first conductivity type;
    after forming the source extension region and the drain extension region, forming a mask comprising a first open region, a second open region, and a blocking region, the first open region exposing a first portion of the semiconductor layer, the first portion of the semiconductor layer being located at an end of the semiconductor layer that is closest to the first gate portion of the gate structure, the second open region exposing a second portion of the semiconductor layer comprising the entire drain extension region, the blocking region being formed over and blocking a third portion of the semiconductor layer, the third portion of the semiconductor layer being located at an end of the semiconductor layer that is furthest from the first gate portion of the gate structure;
    after forming the mask, forming a deep drain region in the semiconductor layer, the deep drain region contacting the drain extension region and abutting the buried insulator layer;
    after forming the mask, forming a deep source region in the first portion of the semiconductor layer, the deep source region contacting the source extension region and abutting the buried insulator layer, the mask preventing a deep source region from being formed within the third portion of the semiconductor layer, the deep drain region and the deep source region being doped with a dopant of the second conductivity type;
    after forming the deep drain region and the deep source region, removing the mask;
    forming a drain metal-semiconductor alloy contact located on an upper portion of the deep drain region and abutting the drain extension region; and
    forming a source metal-semiconductor alloy contact abutting the source extension region, wherein the deep source region is formed below and contacts a first portion of the source metal-semiconductor alloy contact,
    the deep source region is formed such that it is not located below and does not contact a second portion of the source metal-semiconductor alloy contact, the second portion of the source metal-semiconductor alloy contact being formed in the third portion of the semiconductor layer and located above and directly contacting a body portion of the semiconductor layer to form an internal body contact,
    the second portion of the source metal-semiconductor alloy contact is located at an end of the source metal-semiconductor alloy contact that is furthest from the first gate portion of the gate structure,
    a sidewall of the source extension region directly contacts both a sidewall of the second portion of the source metal-semiconductor alloy contact that is located above the body portion of the semiconductor layer, and a sidewall of the first portion of the source metal-semiconductor alloy contact that is located above the deep source region, and
    a doping concentration of the body portion of the semiconductor layer that directly contacts the second portion of the source metal-semiconductor alloy contact is the same as a doping concentration of the body portion of the semiconductor layer that directly contacts the second gate portion of the gate structure.

2. The method of claim 1, wherein the source and drain metal-semiconductor alloy contacts comprise a metal silicide.

3. The method of claim 1, further comprising:
    forming a shallow trench isolation region in the semiconductor layer, the shallow trench isolation region surrounding an active area comprising silicon, the source and drain extension regions and the deep source and drain regions all being formed in the active area, wherein the deep source region directly contacts the buried insulator layer, and the deep source region directly contacts the shallow trench isolation region.

4. The method of claim 1, further comprising:

forming a gate spacer abutting sidewalls of the gate conductor layer and the gate dielectric layer of the second gate portion, wherein the second portion of the source metal-semiconductor alloy contact that is located above the body portion of the semiconductor layer abuts the gate spacer, and no part of the source metal-semiconductor alloy contact is located below the gate spacer.

5. The method of claim 4, wherein the first portion of the source metal-semiconductor alloy contact that is located above the deep source region also abuts the gate spacer.

6. The method of claim 1, wherein the deep source region directly contacts the buried insulator layer.

7. The method of claim 1, wherein the sidewall of the source extension region, the sidewall of the second portion of the source metal-semiconductor alloy contact, and the sidewall of the first portion of the source metal-semiconductor alloy contact are all vertical sidewalls, so that the vertical sidewall of the source extension region directly contacts both the vertical sidewall of the second portion of the source metal-semiconductor alloy contact and the vertical sidewall of the first portion of the source metal-semiconductor alloy contact.

8. The method of claim 1, wherein no part of the source metal-semiconductor alloy contact is deeper than the source extension region, and no part of the drain metal-semiconductor alloy contact is deeper than the drain extension region.

9. The method of claim 1, wherein the gate structure further includes a third gate portion extending from the first gate portion in the second direction, the third gate portion being parallel to the second gate portion.

10. The method of claim 9, wherein the deep source region is located on one side of the second gate portion, the deep drain region is located on another side of the second gate portion, the deep drain region is also located on one side of the third gate portion, and another deep source region is located on another side of the third gate portion.

11. The method of claim 10, wherein the another deep source region is formed below and contacts a first portion of another source metal-semiconductor alloy contact, the another deep source region is formed such that it is not located below and does not contact a second portion of the another source metal-semiconductor alloy contact, the second portion of the another source metal-semiconductor alloy contact being located above and directly contacting another body portion of the semiconductor layer, and the second portion of the another source metal-semiconductor alloy contact is located at an end of the another source metal-semiconductor alloy contact that is furthest from the first gate portion.

12. A method for fabricating a semiconductor device, the method comprising:

providing a semiconductor-on-insulator substrate including a buried insulator layer and an overlying semiconductor layer, the semiconductor layer being doped with a dopant of a first conductivity type;

forming a gate structure on the semiconductor layer, the gate structure comprising a gate dielectric layer located on the semiconductor layer and a gate conductor layer located on the gate dielectric layer, the gate structure including a first gate portion extending in a first direction, and a plurality of second gate portions that each extend from the first gate portion in a second direction, which is perpendicular to the first direction;

forming a gate spacer abutting sidewalls of the gate conductor layer and the gate dielectric layer of one of the second gate portions of the gate structure;

forming a source extension region and a drain extension region in the semiconductor layer, the source extension region and the drain extension region extending under the gate dielectric layer and the gate conductor layer, the source extension region and the drain extension region contacting the gate dielectric layer of the one second gate portion, the source extension region and the drain extension region being doped with a dopant of a second conductivity type, which is opposite the first conductivity type;

after forming the source extension region and the drain extension region, forming a mask comprising a first open region, a second open region, and a blocking region, the first open region exposing a first portion of the semiconductor layer, the first portion of the semiconductor layer being located at an end of the semiconductor layer that is closest to the first gate portion of the gate structure, the second open region exposing second portion of the semiconductor layer comprising the entire drain extension region, the blocking region being formed over and blocking a third portion of the semiconductor layer, the third portion of the semiconductor layer being located at an end of the semiconductor layer that is furthest from the first gate portion of the gate structure;

after forming the mask, forming a deep drain region in the semiconductor layer on one side of the one second gate portion, the deep drain region contacting the drain extension region and abutting the buried insulator layer;

after forming the mask, forming a deep source region in the first portion of the semiconductor layer on an opposite side of the one second gate portion, the deep source region contacting the source extension region and abutting the buried insulator layer, the mask preventing a deep source region from being formed within the third portion of the semiconductor layer, the deep drain region and the deep source region being doped with a dopant of the second conductivity type;

after forming the deep drain region and the deep source region, removing the mask;

forming a drain metal-semiconductor alloy contact on an upper portion of the deep drain region and abutting the drain extension region;

forming a source metal-semiconductor alloy contact abutting the source extension region; and wherein a body region is located in the semiconductor layer, a first portion of the source metal-semiconductor alloy contact is located above and directly contacts the deep source region, a first portion of the body region is below and directly contacts the gate dielectric layer of the one second gate portion, a second portion of the body region is below and directly contacts a second portion of the source metal-semiconductor alloy contact formed in the third portion of the semiconductor layer to form an internal body contact, the second portion of the source metal-semiconductor alloy contact is located at an end of the source metal-semiconductor alloy contact that is furthest from the first gate portion of the gate structure, the gate spacer directly contacts the second portion of the source metal-semiconductor alloy contact that is located above and directly contacts the second portion of the body region of the semiconductor layer, a vertical sidewall of the source extension region directly contacts both a vertical sidewall of the second portion of the source metal-semiconductor alloy contact and a vertical sidewall of the first portion of the source metal-semiconductor alloy contact, and a doping concentration of the first portion of the body region of the semiconductor layer is the same as a doping concentration of the second portion of the body region of the semiconductor layer.

13. The method of claim 12, wherein no part of the source extension region is located below the second portion of the source metal-semiconductor alloy contact.

14. The method of claim 12, wherein no part of the source metal-semiconductor alloy contact is located below the gate spacer.

15. A method for fabricating a semiconductor device, the method comprising:

providing a semiconductor-on-insulator substrate including a buried insulator layer; forming a semiconductor layer overlying the semiconductor-on-insulator substrate, the semiconductor layer being doped with a dopant of a first conductivity type;

forming a gate structure located on the semiconductor layer, the gate structure comprising a gate dielectric layer located on the semiconductor layer and a gate conductor layer located on the gate dielectric layer, the gate structure including a first gate portion extending in a first direction, and a second gate portion extending from the first gate portion in a second direction, which is perpendicular to the first direction;

performing a shallow dopant implant to form a source extension region and a drain extension region in the semiconductor layer on opposite sides of the second gate portion of the gate structure, the source extension region and the drain extension region extending under the gate dielectric layer and the gate conductor layer, the source extension region and the drain extension region contacting the gate dielectric layer of the second gate portion, the source extension region and the drain extension region being doped with a dopant of a second conductivity type, which is opposite the first conductivity type;

after forming the source extension region and the drain extension region, forming a mask comprising a first open region, a second open region, and a blocking region, the first open region exposing a first portion of the semiconductor layer, the first portion of the semiconductor layer being located at an end of the semiconductor layer that is closest to the first gate portion of the gate structure, the second open region exposing a second portion of the semiconductor layer comprising the entire drain extension region, the blocking region being formed over and blocking a third portion of the semiconductor layer, the third portion of the semiconductor layer being located at an end of the semiconductor layer that is furthest from the first gate portion of the gate structure;

after forming the mask, performing a deep dopant implant to form a deep source region and a deep drain region in the semiconductor layer, the deep drain region contacting the drain extension region and abutting the buried insulator layer, the mask preventing a deep source region from being formed within the third portion of the semiconductor layer, the deep source region being formed in the first portion of the semiconductor layer, the deep source region contacting the source extension region and abutting the buried insulator layer, the deep drain region and the deep source region being doped with a dopant of the second conductivity type;

after forming the deep drain region and the deep source region, removing the mask;

forming a source metal-semiconductor alloy contact and a drain metal-semiconductor alloy contact, the drain metal-semiconductor alloy contact located on an upper portion of the deep drain region and abutting the drain extension region, the source metal-semiconductor alloy contact abutting the source extension region, wherein in the performing of the deep dopant implant to form the deep source region and the deep drain region, dopant is implanted into the first portion of the semiconductor layer that will underlay a first portion of the source metal-semiconductor alloy contact, but dopant is not implanted in the third portion of the semiconductor layer that will underlay a second portion of the source metal-semiconductor alloy contact so that the second portion of the source metal-semiconductor alloy contact will be located above and will directly contact the third portion of the semiconductor layer to form an internal body contact, the second portion of the source metal-semiconductor alloy contact is located at an end of the source metal-semiconductor alloy contact that is furthest from the first gate portion of the gate structure, a sidewall of the source extension region directly contacts both a sidewall of the second portion of the source metal-semiconductor alloy contact that is located above the third portion of the semiconductor layer, and a sidewall of the first portion of the source metal-semiconductor alloy contact that is located above the first portion of the semiconductor layer, and a doping concentration of the third portion of the semiconductor layer which directly contacts the second portion of the source metal-semiconductor alloy contact is the same as a doping concentration of another portion of the semiconductor layer that directly contacts the second gate portion of the gate structure.

16. The method of claim 15, further comprising:

forming a gate spacer abutting sidewalls of the gate conductor layer and the gate dielectric layer of the second gate portion, wherein the second portion of the source metal-semiconductor alloy contact that is located above the third portion of the semiconductor layer directly contacts the gate spacer, and no part of the source metal-semiconductor alloy contact is located below the gate spacer.

17. The method of claim 15, wherein the deep source region directly contacts the buried insulator layer.

18. The method of claim 15, wherein the sidewall of the source extension region, the sidewall of the second portion of the source metal-semiconductor alloy contact, and the sidewall of the first portion of the source metal-semiconductor alloy contact are all vertical sidewalls, so that the vertical sidewall of the source extension region directly contacts both the vertical sidewall of the second portion of the source metal-semiconductor alloy contact and the vertical sidewall of the first portion of the source metal-semiconductor alloy contact.

* * * * *